(12) United States Patent
Guha et al.

(10) Patent No.: US 8,115,097 B2
(45) Date of Patent: Feb. 14, 2012

(54) GRID-LINE-FREE CONTACT FOR A PHOTOVOLTAIC CELL

(75) Inventors: Supratik Guha, Yorktown Heights, NY (US); Yves Martin, Yorktown Heights, NY (US); Naim Moumen, Yorktown Heights, NY (US); Robert L. Sandstrom, Yorktown Heights, NY (US); Theodore G. van Kessel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/621,685

(22) Filed: Nov. 19, 2009

(65) Prior Publication Data

US 2010/0218816 A1    Sep. 2, 2010

(51) Int. Cl.
    *H01L 31/18* (2006.01)
    *H01L 31/00* (2006.01)
(52) U.S. Cl. ........ 136/256; 136/252; 136/255; 136/261; 438/98; 438/72; 438/69; 438/57; 438/94; 257/437; 257/184; 257/53; 257/200; 257/436
(58) Field of Classification Search .................. 136/256, 136/252, 255, 261; 438/98, 72, 69, 57, 94; 257/53, 184, 200, 431, 432, 436, 437
See application file for complete search history.

(56) References Cited

U.S. PATENT DOCUMENTS

| | | | |
|---|---|---|---|
| 3,903,427 A | 9/1975 | Pack | |
| 3,903,428 A | 9/1975 | DeJong | |
| 4,163,677 A * | 8/1979 | Carlson et al. | 136/255 |
| 4,748,130 A * | 5/1988 | Wenham et al. | 438/98 |
| 4,838,952 A * | 6/1989 | Dill et al. | 136/256 |
| 4,996,133 A | 2/1991 | Brighton et al. | |
| 5,178,685 A * | 1/1993 | Borenstein et al. | 136/244 |
| 5,259,891 A * | 11/1993 | Matsuyama et al. | 136/244 |

(Continued)

FOREIGN PATENT DOCUMENTS

DE    10 2009 005 168 A1    7/2010

(Continued)

OTHER PUBLICATIONS

Clement, F. et al., "Industrially Feasible Multi-Crystalline Metal Wrap Through (MWT) Silicon Solar Cells Exceeding 16% Efficiency" Solar Energy Materials & Solar Cells (Jun. 1, 2009) pp. 1051-1055, vol. 93, No. 6-7.

(Continued)

*Primary Examiner* — Alexa Neckel
*Assistant Examiner* — Golam Mowla
(74) *Attorney, Agent, or Firm* — Scully, Scott, Murphy & Presser, P.C.; Vazken Alexanian

(57) ABSTRACT

Electrical contact to the front side of a photovoltaic cell is provided by an array of conductive through-substrate vias, and optionally, an array of conductive blocks located on the front side of the photovoltaic cell. A dielectric liner provides electrical isolation of each conductive through-substrate via from the semiconductor material of the photovoltaic cell. A dielectric layer on the backside of the photovoltaic cell is patterned to cover a contiguous region including all of the conductive through-substrate vias, while exposing a portion of the backside of the photovoltaic cell. A conductive material layer is deposited on the back surface of the photovoltaic cell, and is patterned to form a first conductive wiring structure that electrically connects the conductive through-substrate vias and a second conductive wiring structure that provides electrical connection to the backside of the photovoltaic cell.

10 Claims, 13 Drawing Sheets

U.S. PATENT DOCUMENTS

| | | | |
|---|---|---|---|
| 5,421,908 A * | 6/1995 | Yoshida et al. | 136/244 |
| 5,468,988 A * | 11/1995 | Glatfelter et al. | 257/431 |
| 5,626,686 A * | 5/1997 | Yoshida | 136/244 |
| 5,904,566 A * | 5/1999 | Tao et al. | 438/689 |
| 6,639,143 B2 * | 10/2003 | Kim et al. | 136/256 |
| 6,716,737 B2 * | 4/2004 | Plas et al. | 438/612 |
| 6,730,594 B2 * | 5/2004 | Noguchi et al. | 438/653 |
| 6,902,872 B2 * | 6/2005 | Lai et al. | 430/322 |
| 7,217,883 B2 * | 5/2007 | Munzer | 136/256 |
| 7,276,724 B2 * | 10/2007 | Sheats et al. | 257/21 |
| 2003/0199156 A1 * | 10/2003 | Fujii | 438/597 |
| 2006/0162766 A1 * | 7/2006 | Gee et al. | 136/256 |
| 2007/0157965 A1 * | 7/2007 | Park | 136/256 |
| 2007/0186971 A1 | 8/2007 | Lochun et al. | |
| 2007/0235075 A1 * | 10/2007 | Park | 136/252 |
| 2008/0001214 A1 * | 1/2008 | Yamaoka et al. | 257/328 |
| 2008/0185038 A1 | 8/2008 | Sharps | |
| 2008/0276981 A1 * | 11/2008 | Kinoshita et al. | 136/244 |
| 2009/0050190 A1 * | 2/2009 | Nishida et al. | 136/244 |
| 2009/0056804 A1 * | 3/2009 | Hishida | 136/256 |
| 2009/0084437 A1 * | 4/2009 | Nishida et al. | 136/256 |
| 2009/0126788 A1 * | 5/2009 | Hishida et al. | 136/256 |
| 2009/0139570 A1 * | 6/2009 | Kinoshita | 136/256 |
| 2009/0183759 A1 * | 7/2009 | Hishida | 136/244 |
| 2009/0283145 A1 * | 11/2009 | Kim et al. | 136/261 |
| 2009/0314346 A1 * | 12/2009 | Hishida | 136/258 |
| 2010/0024864 A1 * | 2/2010 | Kim et al. | 136/244 |

FOREIGN PATENT DOCUMENTS

| | | |
|---|---|---|
| EP | 2 043 161 A2 | 4/2009 |
| EP | 2 068 369 A1 | 6/2009 |
| EP | 2 234 169 A1 | 9/2010 |
| WO | 2010/081505 A2 | 7/2010 |

OTHER PUBLICATIONS

Van Kerschaver, E. et al., "Back-contact Solar Cells: A Review" Progress in Photovoltaics: Research and Application (Mar. 1, 2006) pp. 107-123, vol. 14, No. 2.

International Search Report dated Aug. 22, 2011, received in International Application No. PCT/EP2010/066149.

* cited by examiner

GRID-LINE-FREE CONTACT FOR A PHOTOVOLTAIC CELL

BACKGROUND

The present invention generally relates to structures that provide electrical contacts only from a backside of a multi junction photovoltaic cell in order to increase an effective area of the photovoltaic cell, and methods of manufacturing the same.

A photovoltaic cell is a device that converts light directly into electricity by the photovoltaic effect. Assemblies of photovoltaic cells are used to make solar panels, solar modules, or photovoltaic arrays. A photovoltaic cell can be formed by providing a large area p-n junction in a semiconductor material.

A space charge region is formed around a p-n junction in a photovoltaic cell. Photons that impinge on the space charge region generate at least one electron-hole pair if absorbed by the semiconductor material in the space charge region. The electrons and holes diffuse in opposite directions, thereby accumulating positive charges in the bulk portion of the p-doped material and accumulating negative charges in the bulk portion of the n-doped material.

Conventional photovoltaic cells are configured to provide a p-doped region on one side of the cell and an n-doped region on the opposite side of the cell. For example, the front side of the cell can be the p-doped region and the back surface of the cell can be the n-doped region, or vice versa. First electrical contacts are made to one node of the photovoltaic cell from the front side, and second electrical contacts are made to the other node of the photovoltaic cell from the back surface. Because the electrical contacts on the front side need to be wired together, a one dimensional array of metal lines is provided on the front side of conventional photovoltaic cells. Such metal lines are called "grid lines" on a photovoltaic cell.

However, such gird lines block a significant portion of the front side of the photovoltaic cell, thereby reducing the effective area of the photovoltaic cell. Moreover, the width of grid lines on the front side cannot exceed a threshold width in order to limit the reduction of the effective area of the photovoltaic cell. Thus, the resistance of the grid lines on the front side of the photovoltaic cell is significant, and the efficiency of the photovoltaic cell is reduced through resistive heating of the grid lines during operation.

BRIEF SUMMARY

In an embodiment of the present invention, a photovoltaic cell that does not employ a wiring structure on the front side is provided. Absence of a wiring structure on the front side increases effective area of the photovoltaic cell. Electrical contact to the front side of the photovoltaic cell is provided by an array of conductive through-substrate vias, and optionally, an array of conductive blocks located on the front side of the photovoltaic cell. A dielectric liner provides electrical isolation of each conductive through-substrate via from the semiconductor material of the photovoltaic cell. A dielectric layer on the backside of the photovoltaic cell is patterned to cover a contiguous region including all of the conductive through-substrate vias, while exposing a portion of the backside of the photovoltaic cell. A conductive material layer is deposited on the back surface of the photovoltaic cell, and is patterned to form a first conductive wiring structure that electrically connects the conductive through-substrate vias and a second conductive wiring structure that provides electrical connection to the backside of the photovoltaic cell.

According to an aspect of the present invention, a photovoltaic cell structure is provided. The photovoltaic cell structure includes a substrate, at least one laterally-insulated through-substrate contact structure, a first contiguous metal wiring structure, and a second contiguous metal wiring structure. The substrate includes a photovoltaic material that generates a non-zero electric potential across a front surface and a back surface of the substrate upon irradiation by electromagnetic radiation. The at least one laterally-insulated through-substrate contact structure is embedded in the substrate. Each of the at least one laterally-insulated through-substrate contact structure includes a dielectric liner and a conductive through-substrate via, which is conductively connected to a surface portion of the substrate located at the front surface and electrically isolated from the back surface. The first contiguous metal wiring structure is spaced from the back surface, and is in contact with at least one conductive through-substrate via in the at least one laterally-insulated through-substrate contact structure. The second contiguous metal wiring structure is in contact with the back surface of the substrate. The non-zero electric potential is provided across the first and second contiguous metal wiring structures.

According to another aspect of the present invention, a method of forming a photovoltaic cell structure is provided. A dielectric layer is formed on a back surface of a substrate, which includes a photovoltaic material that generates a non-zero electric potential between a front surface and the back surface of the substrate upon irradiation by electromagnetic radiation. At least one through-substrate trench is formed in the substrate. At least one laterally-insulated through-substrate contact structure is formed in the substrate by filling the at least one through-substrate trench. A first contiguous metal wiring structure is formed on at least one conductive through-substrate via in the at least one laterally-insulated through-substrate contact structure. The first contiguous metal wiring structure is spaced from the back surface by the dielectric layer. A second contiguous metal wiring structure is formed directly on the back surface of the substrate.

BRIEF DESCRIPTION OF SEVERAL VIEWS OF THE DRAWINGS

Figures with a suffix "A" are top down views.

FIGS. 1-3 and 4A-9B are views of a first exemplary photovoltaic cell structure at various stages of a manufacturing process according to a first embodiment of the present invention.

DETAILED DESCRIPTION

Figure 1:
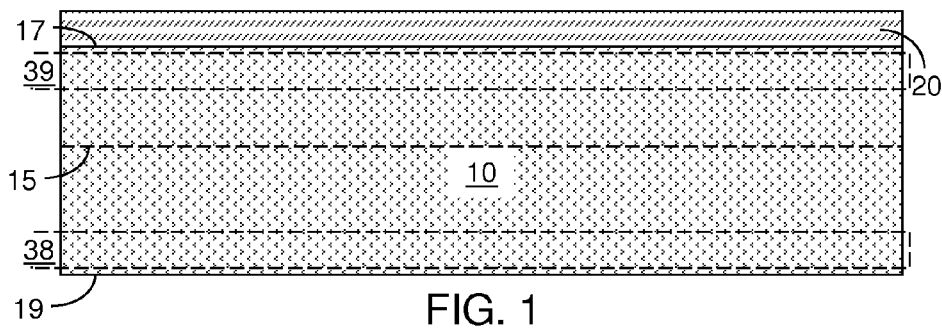
FIGS. 1-3 and figures with a suffix "B" are vertical cross-sectional views. A B-B' plane in a figure with a numeric label and the suffix "A" is the plane of the vertical cross-sectional view for the figure with the same numeric label and the suffix "B."

As stated above, the present invention relates to structures that provide electrical contacts only from a backside of a multi-junction photovoltaic cell in order to increase an effective area of the photovoltaic cell, and methods of manufacturing the same, which are now described in detail with accompanying figures. Throughout the drawings, the same reference numerals or letters are used to designate like or equivalent elements. The drawings are not necessarily drawn to scale.

As used herein, a "photovoltaic material" refers to any material that generates a voltage difference between two terminals upon irradiation by electromagnetic radiation. The electromagnetic radiation can include the visible spectrum, the ultraviolet range, and the infrared range.

As used herein, a first element is "conductively connected" to a second element if there is a conduction path between the first and second elements that allow passing of an electrical current.

As used herein, a "proximal surface" of an element that is located on a substrate refers to the surface of that element that is closest to the substrate.

As used herein, a "distal surface" of an element that is located on a substrate refers to the surface of that element this is farthest away from the substrate.

As used herein, a first element is "directly adjoined to" a second element if the first and second elements make a physical contact at a point, at a one-dimensional curve, or at a two-dimensional surface.

As used herein, a "laterally-insulated through-substrate contact structure" is a structure including a conductive element and an insulating element, in which the conductive element conductively connects a first element located on one side of a substrate and a second element located on the opposite side of the substrate, and the insulting element electrically isolates the conductive element from the substrate.

Referring to FIG. 1, a first exemplary photovoltaic cell structure according to a first embodiment of the present invention includes a substrate 10 and an anti-reflective layer 20 located on the front surface 17 of the substrate 10. The substrate 10 includes a photovoltaic material that generates a non-zero electric potential between the front surface 17 and the back surface 19 of the substrate 10 upon irradiation by electromagnetic radiation. The electromagnetic radiation can be in the visible spectrum, ultraviolet range, and/or infrared range.

The photovoltaic material can be a crystalline material or an amorphous material. The crystalline material can be single crystalline silicon, polycrystalline silicon, germanium, gallium indium, and/or gallium arsenide (GaAs). The amorphous and multicrystalline material can be amorphous silicon, cadmium telluride (CdTe), and/or copper indium diselenide ($CuInSe_2$, or CIS). The photovoltaic material can be in the form of a block, or can be in the form of a thin film In case the photovoltaic material is a semiconductor material, the photovoltaic material can have a built-in p-n junction 15 in the substrate 10. In this case, the substrate includes a p-doped semiconductor material and an n-doped semiconductor material that collectively form the p-n junction 15 at a surface between the front surface 17 and the back surface 19 of the substrate 10. In general, any type of photovoltaic material can be employed in the substrate 10 for the purposes of the present invention.

The substrate 10 includes a "surface portion" 39, which is a portion of the substrate 10 directly beneath the front surface 17 of the substrate 10. Electrical charges of one type accumulate in the surface region 39 of the substrate 10 when the photovoltaic material in the substrate 10 is exposed to electromagnetic radiation. The surface region 39 is a front surface portion of the photovoltaic material that is located on the front side on the substrate 10 and is spaced from the p-n junction 15. Electrical charges of the opposite type accumulate in a back surface region 38 of the substrate 10 this is located directly on the back surface 19 of the substrate 10. If the substrate 10 is flipped upside down, the back surface region 38 of the substrate 10 is located directly underneath the back surface 19 of the substrate 10.

The anti-reflective layer 20 is located directly on the front surface 17 of the substrate 10. In the first exemplary photovoltaic cell structure, the anti-reflective layer 20 can be a dielectric material, a semiconducting material, or a conductive material. The anti-reflective layer 20 minimizes reflection of the electromagnetic radiation in the wavelength range that the photosensitive material in the substrate 10 absorbs. The thickness of the anti-reflective layer 20 can be optimized to minimize the reflection of the electromagnetic radiation. For example, the thickness of the anti-reflective layer 20 can be from 5 nm to 100 nm, although lesser and greater thickness can be employed. Preferably, the conductive material of the anti-reflective layer 20 has a low absorption coefficient for electromagnetic radiation in the wavelength range that the photosensitive material in the substrate 10 absorbs. The anti-reflective layer 20 can have a homogeneous composition, or can include a plurality of layers having different compositions. Any other anti-reflective material can be employed for the anti-reflective layer 20 of the first embodiment of the present invention.

Figure 2:
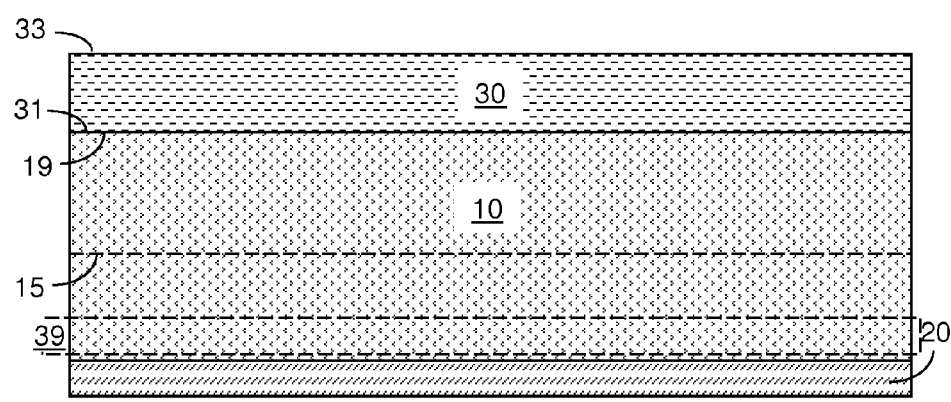

Referring to FIG. 2, the substrate 10 can be flipped upside down so that the back surface 19 of the substrate 10 faces up and the anti-reflective layer 20 faces down. A dielectric layer 30 is formed on the back surface 19 of the substrate 10. The dielectric layer 30 can be formed, for example, by chemical vapor deposition (CVD) of a dielectric material. The dielectric material for the dielectric layer 30 can be silicon oxide, silicon nitride, a dielectric metallic oxide, a dielectric metallic nitride, or a combination thereof. The thickness of the dielectric layer 30, as measured between a proximal surface 31 of the dielectric layer 30 that contacts the back surface of the substrate 10 and a distal surface 33 of the dielectric layer 30 that is exposed, can be from 10 nm to 10,000 nm, and preferably from 100 nm to 1,000 nm, although lesser and greater thicknesses can be employed.

Figure 3:
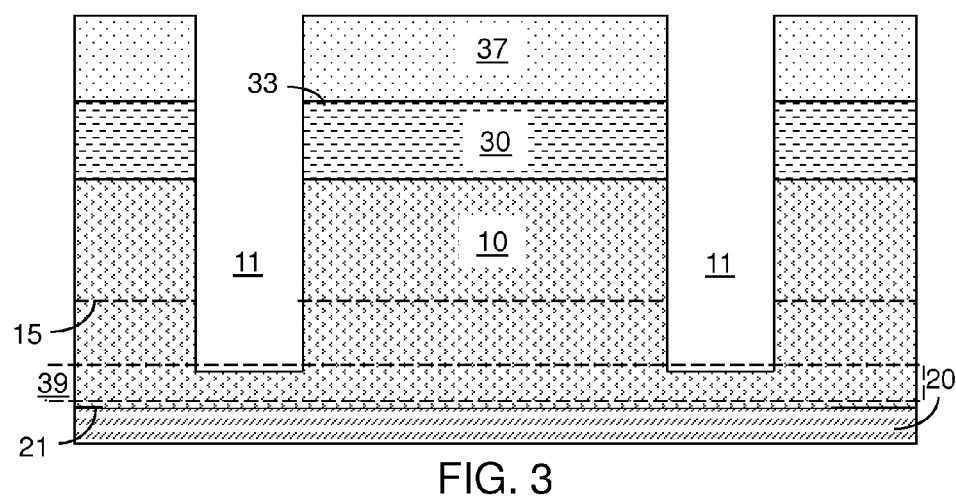

Referring to FIG. 3, at least one through-substrate trench 11 is formed in the dielectric layer 30 and the substrate 10. For example, a first photoresist 37 can be applied over the exposed upper surface of the dielectric layer 30, and lithographically patterned to form at least one opening. The at least one opening in the photoresist 37 can be a plurality of openings. The plurality of openings in the photoresist 37 can be, for example, a one-dimensional array of openings or a two-dimensional array of openings.

The pattern in the at least one opening in the photoresist 37 is transferred into the dielectric layer 30 and the substrate 10 to form the at least one through-substrate trench 11, which extends from the distal surface 33 of the dielectric layer 30 to a depth within the surface region 39 of the substrate 10. An anisotropic etch, such as a reactive ion etch (RIE), can be employed to etch the material of the dielectric layer 30 and the substrate 10 selective to the photoresist 37. The horizontal cross-sectional area of the at least one through-substrate trench 11 can be substantially constant as a function of depth within the at least one through-substrate trench 11, or alternately, the horizontal cross-sectional area of the at least one through-substrate trench 11 can decrease as a function of depth due to a taper in the sidewalls of the at least one through-substrate trench 11.

The anisotropic etch employed to form the at least one through-substrate trench 11 can be timed to stop when at least one bottom surface of the at least one through-substrate trench 11 is within the surface region 39 of the substrate 10. The anisotropic etch stops before the at least one bottom surface of the at least one through-substrate trench 11 reaches the anti-reflective layer 20. Thus, the at least one bottom surface of the at least one through-substrate trench 11 exposes a surface at which electrical charges accumulate when the photovoltaic material of the substrate 10 is illuminated by electromagnetic radiation. The first photoresist 37 is subsequently removed, for example, by ashing.

Figure 4A:
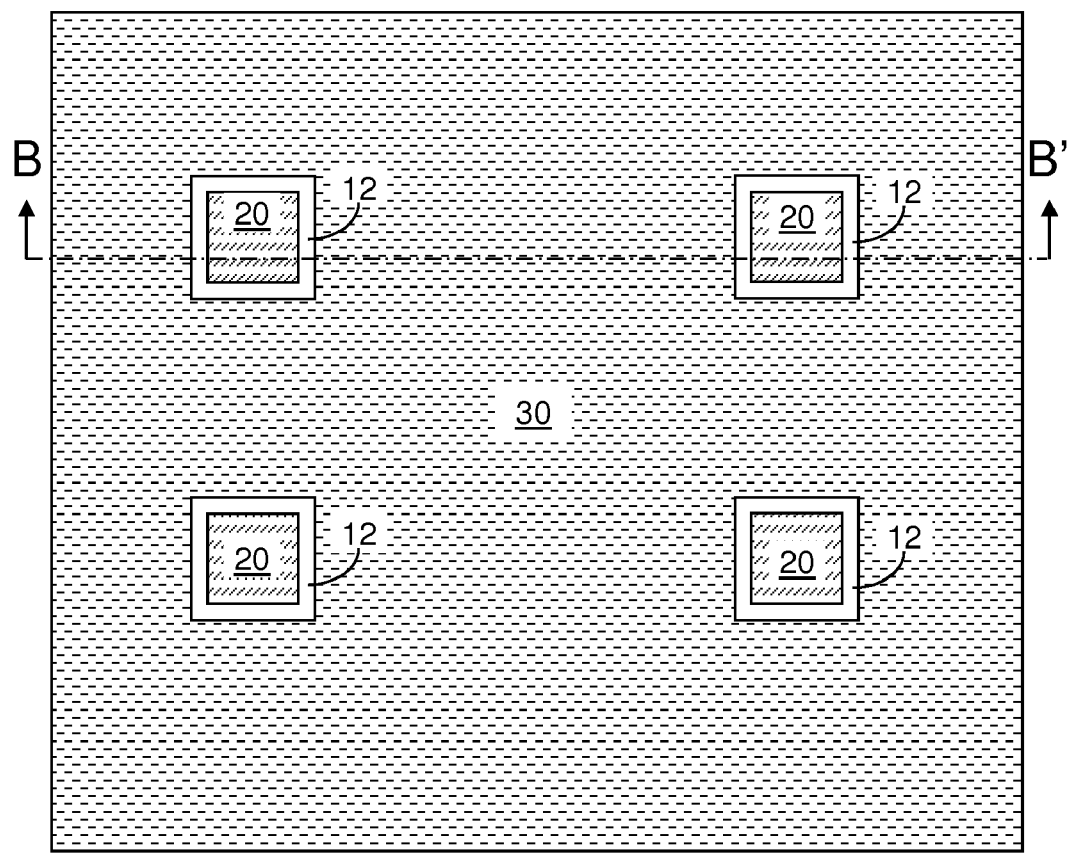
Figure 4B:
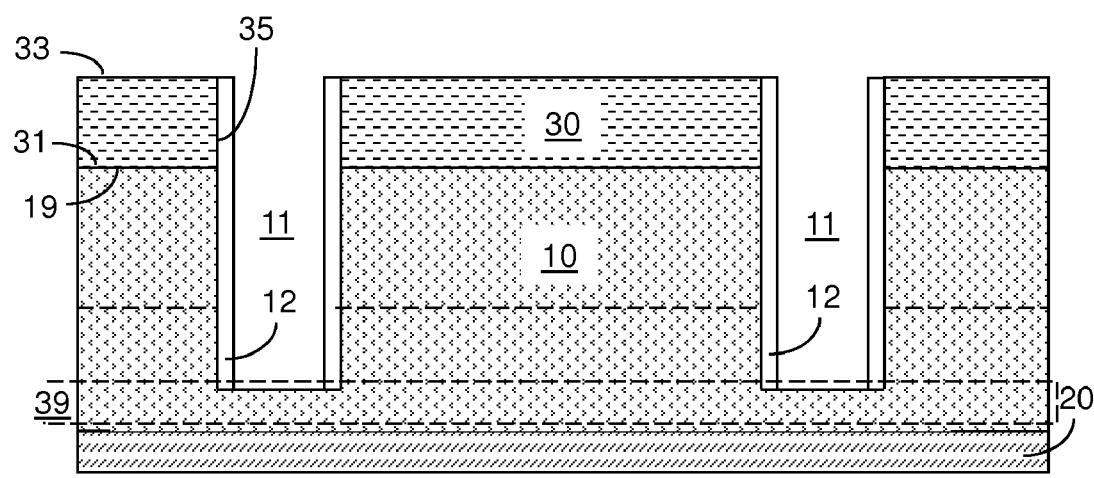

Referring to FIGS. 4A and 4B, at least one dielectric liner 12 is formed on the sidewalls of the at least one through-substrate trench 11. For example, the at least one dielectric liner 12 can be formed by depositing a dielectric material layer and anisotropically etching the horizontal portions of the dielectric material layer. The remaining vertical portions of the dielectric material layer on the sidewalls of the at least one through-substrate trench 11 constitute the at least one dielectric liner 12. The top portion of the at least one dielectric liner 12 can be substantially coplanar with the distal surface 33 of the dielectric layer 30. Thus, the at least one dielectric liner 12 protrudes out of the back surface of the substrate and contacts a sidewall of the dielectric layer 30.

Figure 5A:
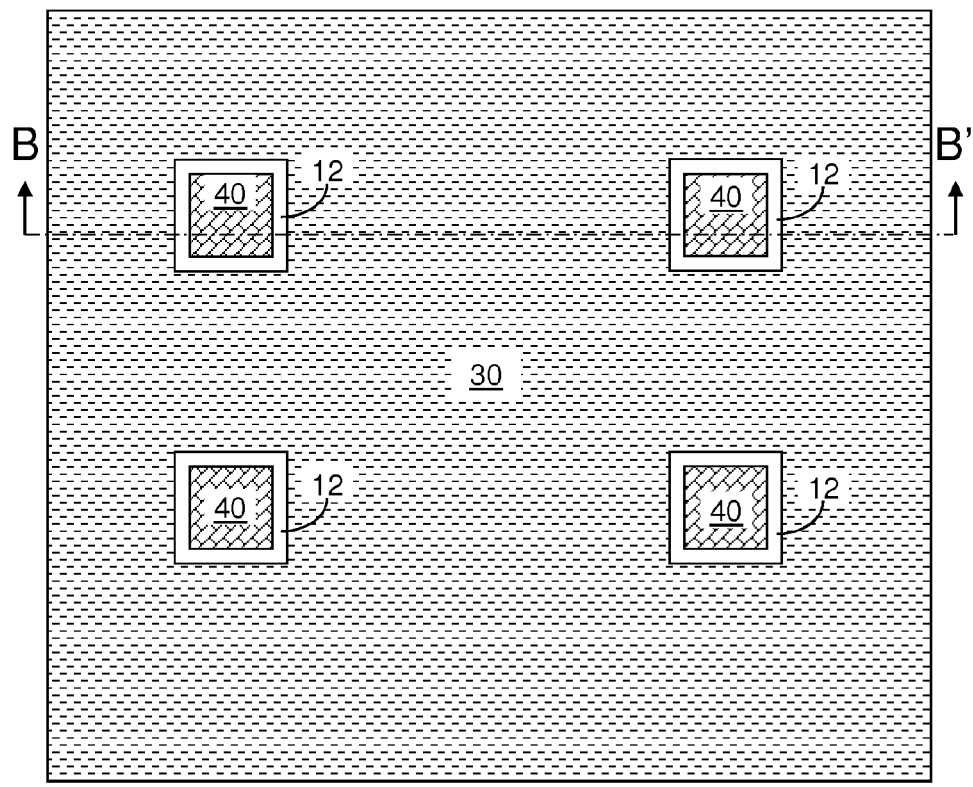
Figure 5B:
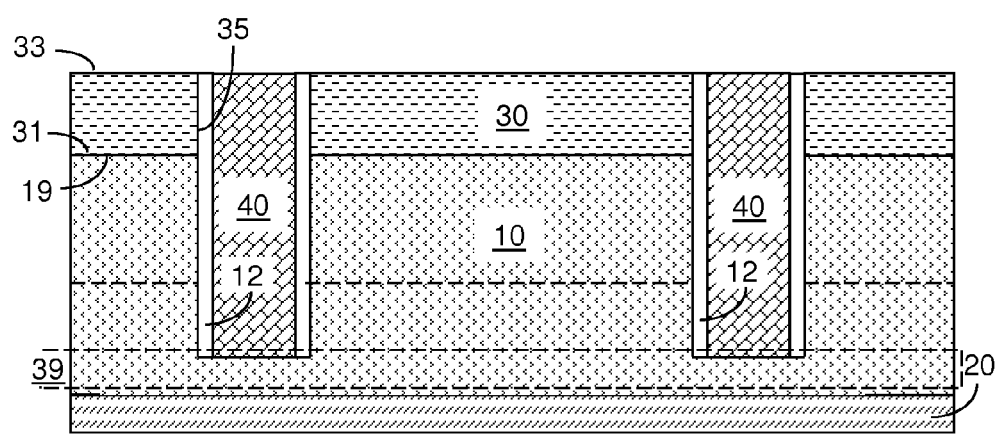

Referring to FIGS. 5A and 5B, the at least one through-substrate trench 11 is filled with a conductive material to form at least one conductive through-substrate via 40. The conductive material can be, for example, W, Al, Cu, Ag, Au, WN, TaN, TiN, a conducting doped semiconductor material, a conductive metal semiconductor alloy, or a combination thereof. The conductive material can be deposited by electroplating, electroless plating, chemical vapor deposition (CVD), atomic layer deposition (ALD), physical vapor deposition (PVD), or a combination thereof. The excess material on the distal surface 33 of the dielectric layer 30 can be removed, for example, by chemical mechanical planarization, a recess etch, or a combination thereof.

The at least one dielectric liner 12 and the at least one conductive through-substrate via 40 collectively constitute at least one laterally-insulated through-substrate contact structure (12, 40), which is embedded in the substrate 10 and provides a vertical conductive path that is electrically isolated in the lateral direction. Thus, the at least one conductive through-substrate via 40 is conductively connected only to the surface region 39 of the substrate 10, but is not conductively connected to any other portion of the substrate 10. Particularly, the conductive through-substrate via 40 is electrically isolated from the back surface 19 of the substrate 10.

A backside end surface of the at least one conductive through-substrate via 40 can be substantially coplanar with the distal surface 33 of the dielectric layer 30. Each of the at least one laterally-insulated through-substrate contact structure (12, 40) includes a dielectric liner 12 and a conductive through-substrate via 40 that is conductively connected to the surface region 39 of the substrate 10 and is electrically isolated from the back surface 19 of the substrate 10. A portion of the at least one conductive through-substrate via 40 protrudes out of the back surface 19 of the substrate 10.

The at least one laterally-insulated through-substrate contact structure (12, 40) can be a plurality of laterally-insulated through-substrate contact structures (12, 40), and can be a one-dimensional array or a two-dimensional array of laterally-insulated through-substrate contact structures (12, 40).

Figure 6A:
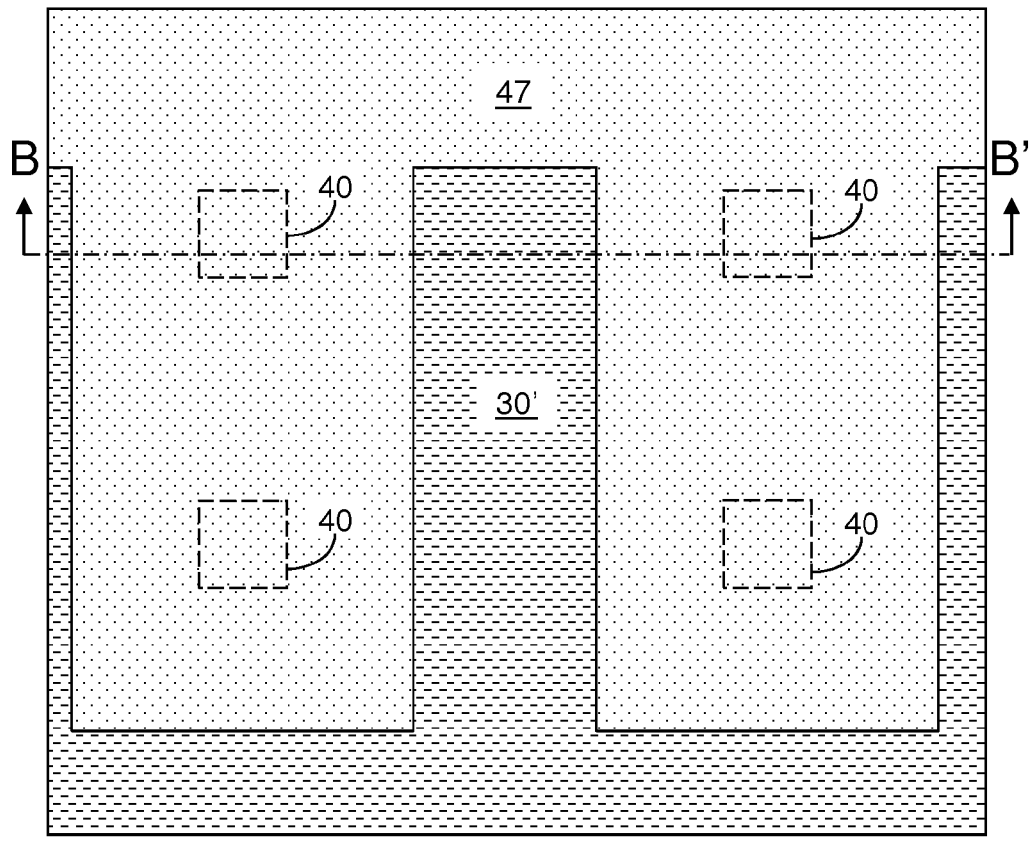
Figure 6B:
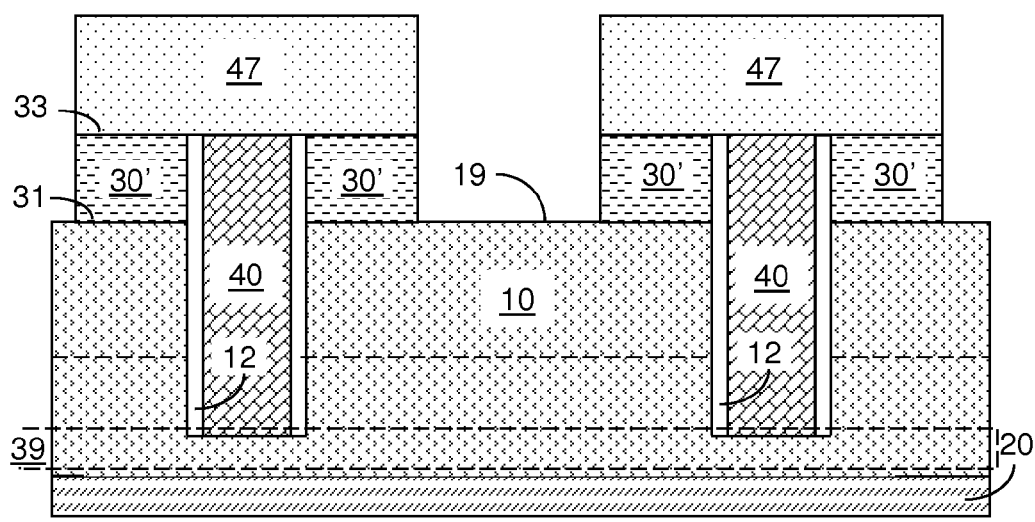

Referring to FIGS. 6A and 6B, a second photoresist 47 is applied on the distal surface 33 of the dielectric layer 30. The second photoresist 47 is lithographically patterned so that all of the at least one conductive through-substrate via 40 is covered by the second photoresist 47, while the distal surface 33 of the dielectric layer 30 is exposed in areas between the at least one conductive through-substrate via 40. The location of the at least one conductive through-substrate via 40 is shown in dotted lines in FIG. 6A. The sidewalls of the second photoresist 47 after lithographic patterning can be a contiguous surface overlying a contiguous line on the distal surface 33 of the dielectric layer 30, in which the contiguous line separates a contiguous area including the areas of all of the at least one conductive through-substrate via 40 from a complementary area.

The pattern in the second photoresist 47 is transferred into the dielectric layer 30 to form a patterned dielectric layer 30', which is a remaining portion of the dielectric layer 30 after the transfer of the pattern in the second photoresist 47. A contiguous portion of the back surface 19 of the substrate 10 is exposed after the formation of the patterned dielectric layer 30'. The second photoresist 47 is subsequently removed. Preferably, the removal of the second photoresist 47 is selective to the substrate 10 and the patterned dielectric layer 30'.

Figure 7A:
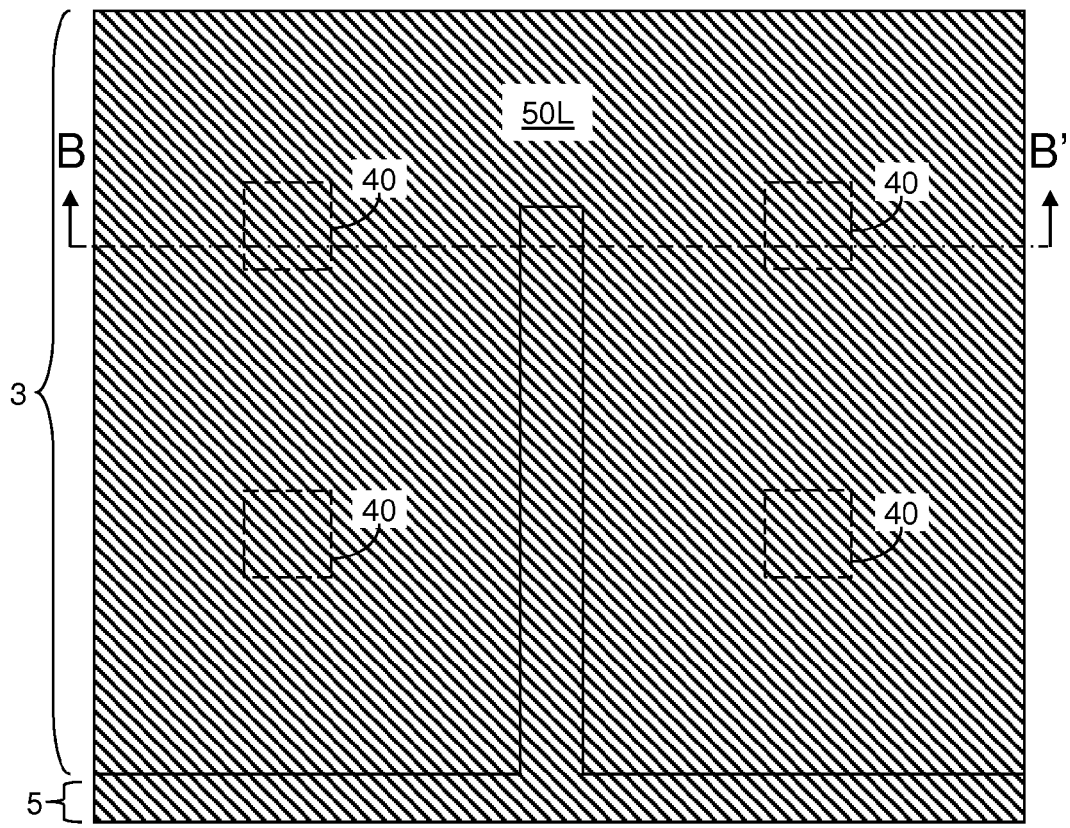
Figure 7B:
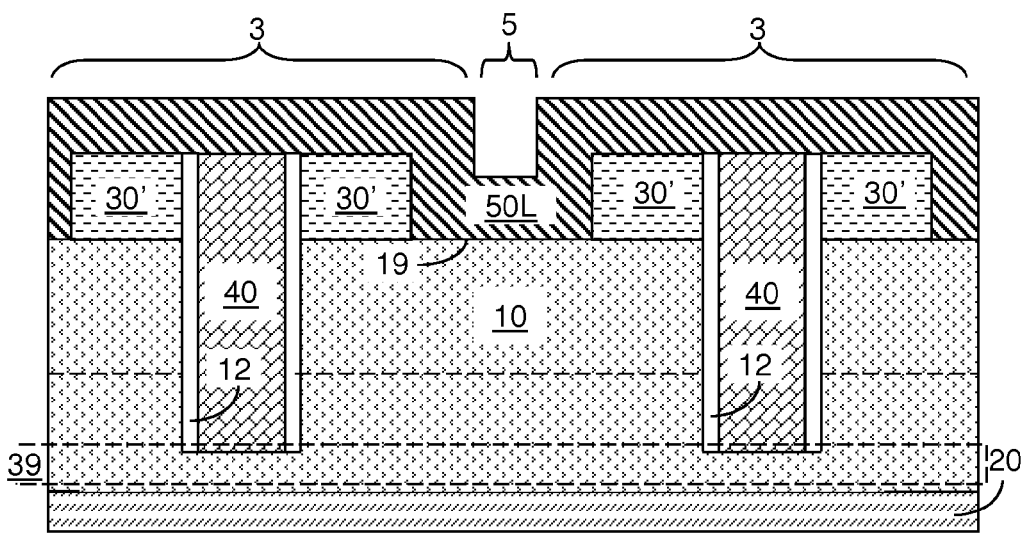

Referring to FIGS. 7A and 7B, a conductive material layer 50L is deposited on the back surface 19 of the substrate 10 and the exposed surface(s), i.e., the backside end surface(s), of at least one conductive through-substrate via 40. The conductive material layer 50L has a conductive material such as W, Al, Cu, Ag, Au, WN, TaN, TiN, a conducting doped semiconductor material, a conductive metal semiconductor alloy, or a combination thereof. Preferably, the conductive material of the conductive material layer 50L is a metallic material. The conductive material layer 50L can be formed, for example, by electroplating, electroless plating, chemical vapor deposition (CVD), atomic layer deposition (ALD), physical vapor deposition (PVD), or a combination thereof. The thickness of the conductive material layer 50L can be from 100 nm to 10,000 nm, and typically from 300 nm to 3,000 nm, although lesser and greater thicknesses can also be employed. The conductive material layer 50L can include a non-recessed region 3 and a recessed region 5. The non-recessed region 3 is located over the patterned dielectric layer 30' and the at least one conductive through-substrate via 40. The recessed region 5 is located over a portion of the back surface 19 of the substrate 10 that does not contact the patterned dielectric layer 30'. The conductive material layer 50L can have substantially vertical sidewalls between an exposed surface of the non-recessed region 3 and an exposed surface of the recessed region 5.

Figure 8A:
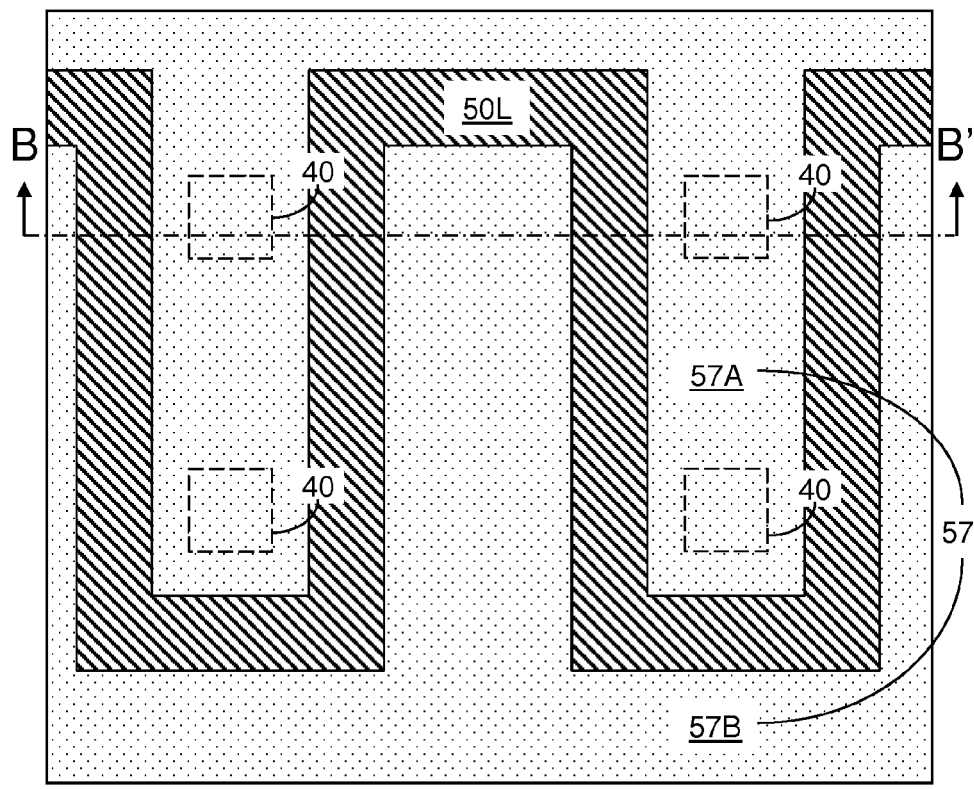
Figure 8B:
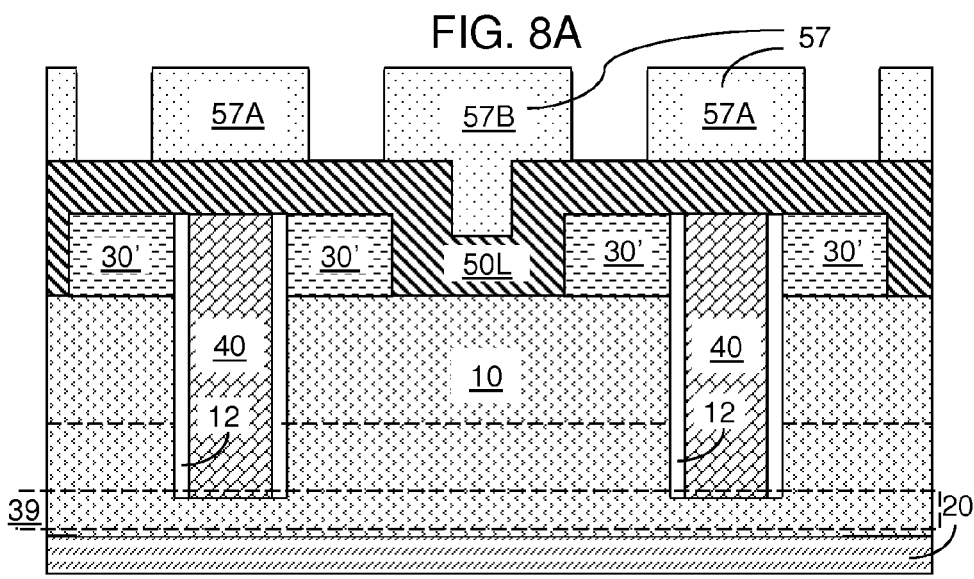

Referring to FIGS. 8A and 8B, a third photoresist 57 is applied over the conductive material layer 50L and lithographically patterned into two contiguous photoresist portions that are separated from each other. A first contiguous region 57A of the third photoresist 57 overlies all of the at least one conductive through-substrate via 40. Preferably, the area covered by the first contiguous region 57A of the third photoresist 57 is less than the area covered by the second photoresist 47 (See FIG. 6A) after lithographic patterning. The second contiguous region 57B of the third photoresist 57 overlies all of the recessed region 5 (See FIGS. 7A and 7B) of the conductive material layer 50L.

In one embodiment, the sidewalls of the second contiguous region 57B of the third photoresist 57 overlie the patterned dielectric layer 30'.

Figure 9A:
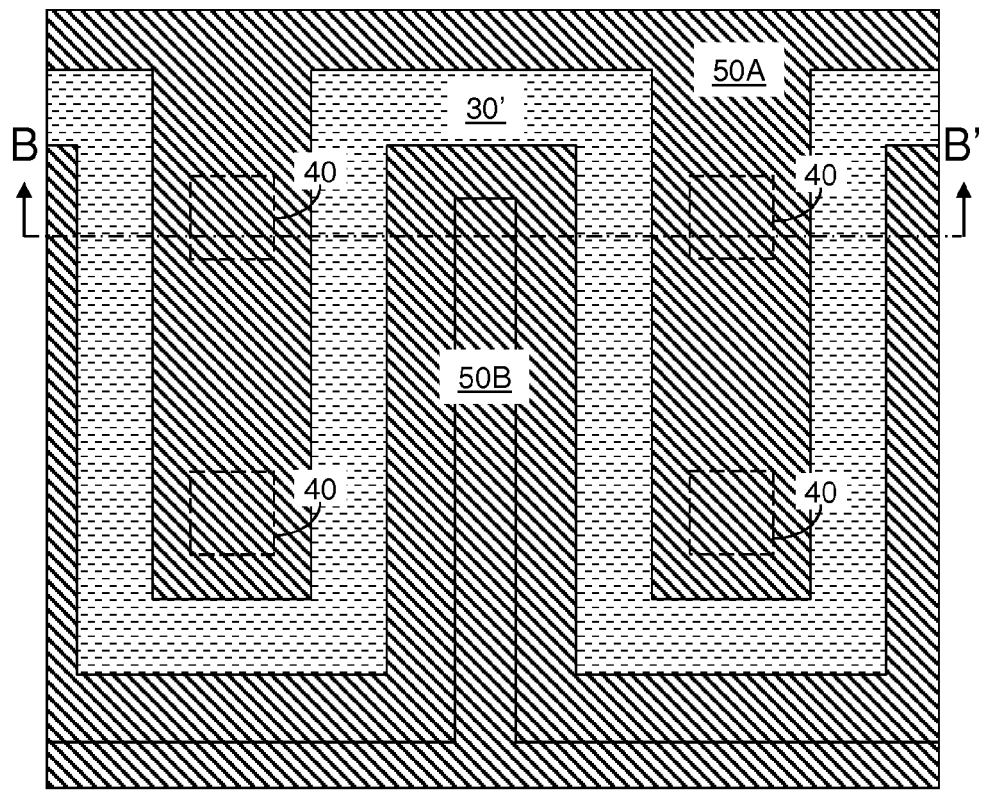
Figure 9B:
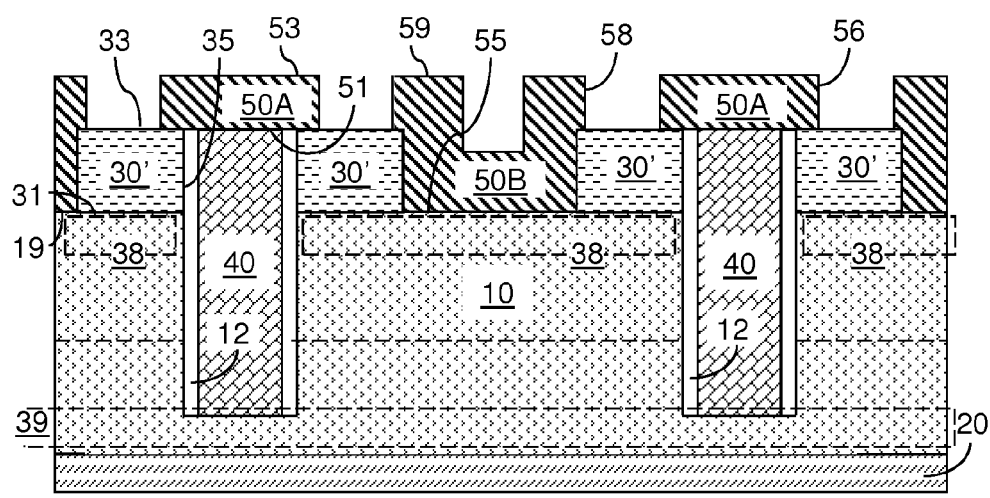

Referring to FIGS. 9A and 9B, the pattern in the third photoresist 57 is transferred into the conductive material layer 5OL, for example, by an anisotropic etch. A first remaining portion of the conductive material layer 50L is formed under the first contiguous potion 57A of the third photoresist 57, and a second remaining portion of the conductive material layer 50L is formed under the second contiguous region 57B of the third photoresist 57. The first remaining portion of the conductive material layer 50L is derived from the portion of the conductive material layer 50L in the non-recessed region 3 (See FIGS. 7A and 7B). The second remaining portion of the conductive material layer 50L includes the portion of the conductive material layer 50L in the recessed region 5 (See FIGS. 7A and 7B).

The first remaining portion of the conductive material layer 50L constitutes a contiguous metal wiring structure 50A, and the second remaining portion of the conductive material layer 50L constitutes a second contiguous metal wiring structure 50B. The first contiguous metal wiring structure 50A and the second contiguous metal wiring structure 50B are laterally separated from each other by a contiguous space.

The first contiguous metal wiring structure 50A is formed on at least one conductive through-substrate via 40 in the at least one laterally-insulated through-substrate contact structure (12, 40). The first contiguous metal wiring structure 50A is vertically spaced from the back surface 19 of the substrate 10 by the patterned dielectric layer 30'. The second contiguous metal wiring structure SOB is formed directly on the back surface 19 of the substrate 10. The third photoresist 57 are subsequently removed, for example, by ashing.

The patterned dielectric layer 30' can have a distal surface 33 that is substantially coplanar with an end surface of the at least one conductive through-substrate via 40. The patterned dielectric layer 30' can have a proximal surface 31 that contacts a portion of the back surface 19 of the substrate 10. Further, the patterned dielectric layer 30' can have a vertical surface 35 that contacts outer sidewalls of the at least one dielectric liner 12.

A proximal surface 51 of the first contiguous metal wiring structure 50A is in contact with the distal surface 33 of the patterned dielectric layer 30'. The entirety of a proximal surface 51 of the first contiguous metal wiring structure 50A can be coplanar with the distal surface 33 of the patterned dielectric layer 30'. All vertical sidewalls 56 of the first contiguous metal wiring structure 50A can be directly adjoined to the distal surface 33 of the patterned dielectric layer 30'. Some vertical sidewalls 58 of the second contiguous metal wiring structure 50B can be directly adjoined to the distal surface 33 of the patterned dielectric layer 30'. The distal surface 59 of the second contiguous metal wiring structure 5013 can be coplanar with a distal surface 53 of the first contiguous metal wiring structure 50A.

The first contiguous metal wiring structure 50A functions as one node of the first exemplary photovoltaic cell, and the second contiguous metal wiring structure 5013 functions as the other node of the first exemplary photovoltaic cell. The first contiguous metal wiring structure 50A makes an electrical contact with the surface region 39 through the at least one conductive through-substrate via 40. The second contiguous metal wiring structure 50B makes physical contact and electrical contact with the back surface 19 of the substrate 10, thereby making electrical contact with a backside surface region 38 of the substrate 10. Electrical charges of one type accumulate in the surface region 39 of the substrate upon illumination of electromagnetic radiation on the substrate 10. At the same time, electrical charges of the opposite type accumulate in the backside surface region 38 of the substrate 10. Thus, non-zero electric potential is provided across the first and second contiguous metal wiring structures (50A, 50B) upon irradiation of the substrate 10 with electromagnetic radiation.

Conductive wiring structure can be absent on the front side of the first exemplary photovoltaic cell structure because all conductive wiring structures (50A, 50B) are provided on the backside of the substrate 10. The entirety of the front surface of the first exemplary photovoltaic cell structure can be covered by the anti-reflective layer 20 that is contiguous and does not contain any hole. Thus, the first exemplary photovoltaic cell structure provides enhanced area utilization over prior art photovoltaic cell structures that require a set of conductive wiring structures on the front side. The enhanced area utilization in the first exemplary photovoltaic cell structure increases the efficiency and/or compactness over prior art structures.

The loss in the effective area for photogeneration of electric charges in the first exemplary photovoltaic cell structure is due to the area occupied by the at least one laterally-insulated through-substrate contact structures (12, 40), which can be less than 2% of the area of the substrate 10. This contrasts with a real loss over 10% due to the presence of metal lines on the front side of prior art photovoltaic cell structures. Thus, the first exemplary photovoltaic cell structure provides greater efficiency by utilizing more fraction of the area provided by the substrate 10 for photogeneration of electricity. Further, the at least one conductive through-substrate via 40 provides an effective and short conductive path to the backside of the substrate 10, and the first contiguous metal wiring structures 50A can utilize a significant fraction, e.g., 40% or more, of the area of the substrate 10 to form a conductive path, thereby reducing the resistivity of the first contiguous metal wiring structures 50A.

Figure 10A:
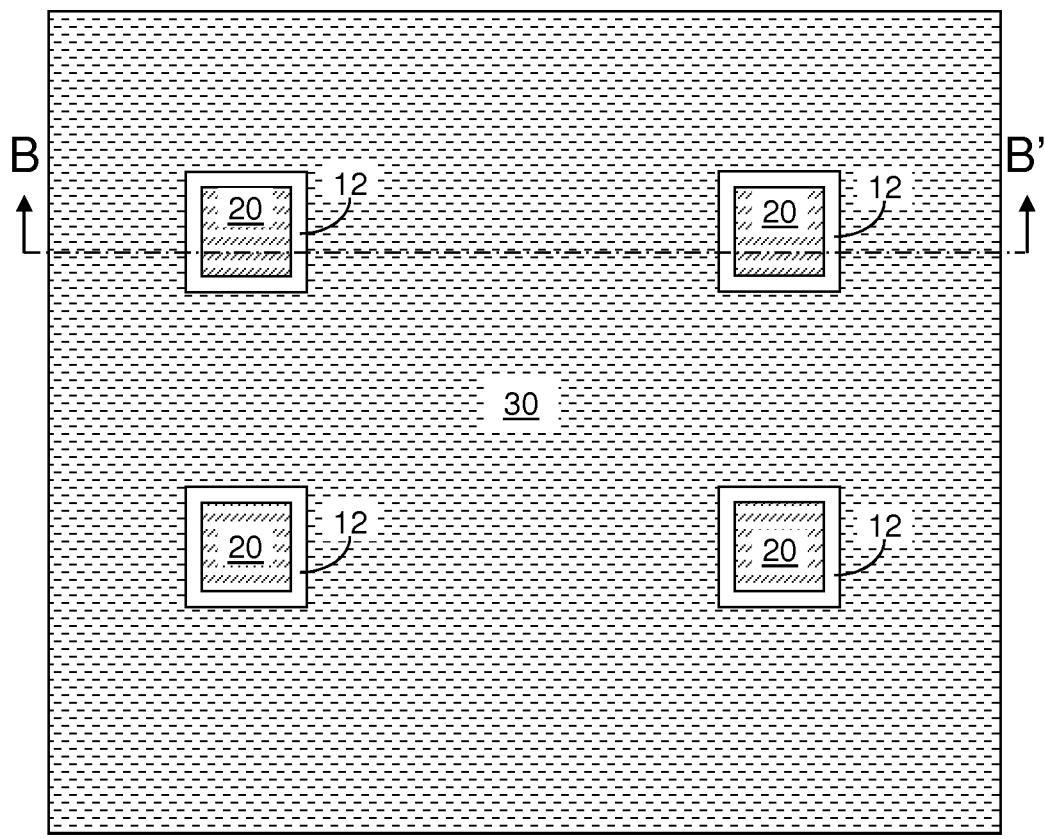
FIGS. 10A-12B are views of a second exemplary photovoltaic cell structure at various stages of a manufacturing process according to a second embodiment of the present invention.
Figure 10B:
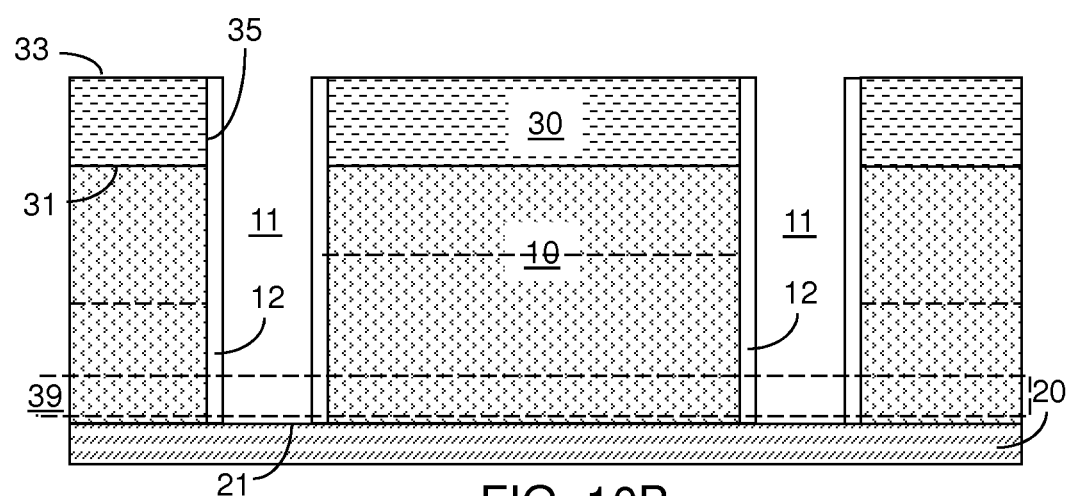

Referring to FIGS. 10A and 10B, a second exemplary photovoltaic cell structure according to a second embodiment of the present invention is derived from the first exemplary photovoltaic cell structure of FIG. 3 by employing a conductive material for the anti-reflective layer 20 and extending the anisotropic etch during the formation of the at least one through-substrate trench 11.

The anisotropic etch employed to form the at least one through-substrate trench 11 is extended to etch through all of the surface region 39 in the substrate 10. The anisotropic etch can employ an endpoint scheme to stop at the proximal surface 21 of the anti-reflective layer 20. Alternately or additionally, the etch chemistry for the anisotropic etch can be selected to be selective to the material of the anti-reflective layer 20, i.e., to etch only the photosensitive material of the substrate 10 and not to etch the material of the anti-reflective layer 20. In a variation of the second embodiment, the anti-reflective layer 20 can be partially etched so that a bottom surface of the at least one through-substrate trench 11 is located within a portion of the anti-reflective layer 20.

At least one dielectric liner 12 is formed on the sidewalls of the at least one through-substrate trench 11 as in the first embodiment. The at least one dielectric liner 12 can have the same composition as, and can be formed by the same methods as, in the first embodiment. The at least one dielectric liner 12 of the second embodiment contacts the anti-reflective layer 20. Thus, the at least one dielectric liner 12 of the second embodiment extends from the distal surface 33 of the dielectric layer 30, through the dielectric layer 30 and the substrate 10, and to the anti-reflective layer 20.

Figure 11A:
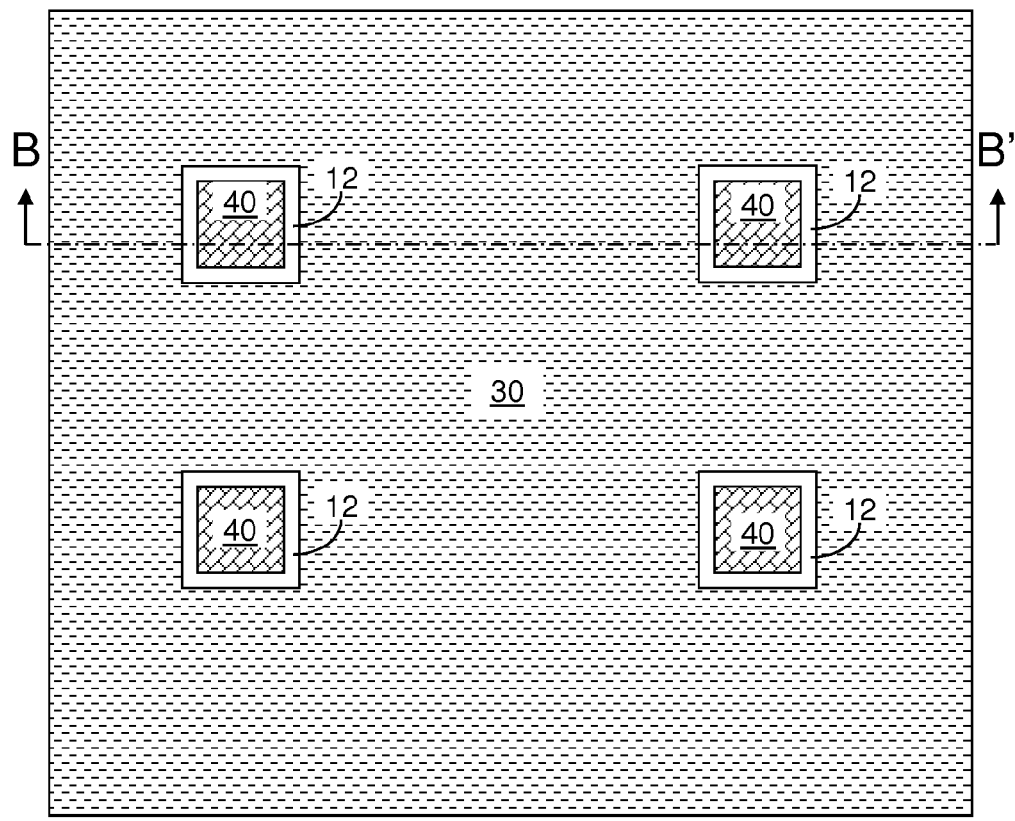
Figure 11B:
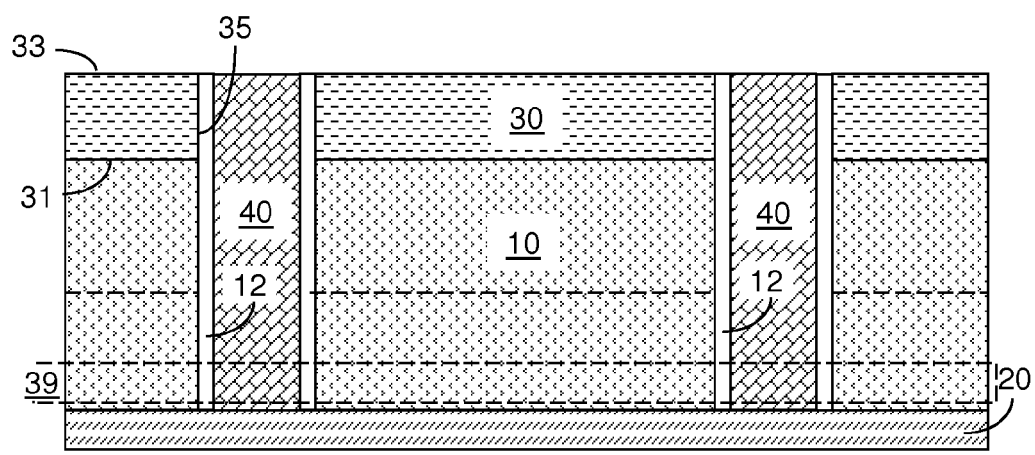

Referring to FIGS. 11A and 11B, the at least one through-substrate trench 11 is filled with a conductive material to form at least one conductive through-substrate via 40 as in the first embodiment. The conductive material can have the same composition as, and can be formed by the same methods as, in the first embodiment. The at least one dielectric liner 12 and the at least one conductive through-substrate via 40 collectively constitute at least one laterally-insulated through-substrate contact structure (12, 40), which is embedded in the substrate 10, and provides a vertical conductive path that is electrically isolated in the lateral direction. The at least one conductive through-substrate via 40 is conductively connected to the surface region 39 of the substrate 10 through the anti-reflective layer 20, but is not conductively connected to any other portion of the substrate 10. Particularly, the conductive through-substrate via 40 is electrically isolated from the back surface 19 of the substrate 10.

Figure 12A:
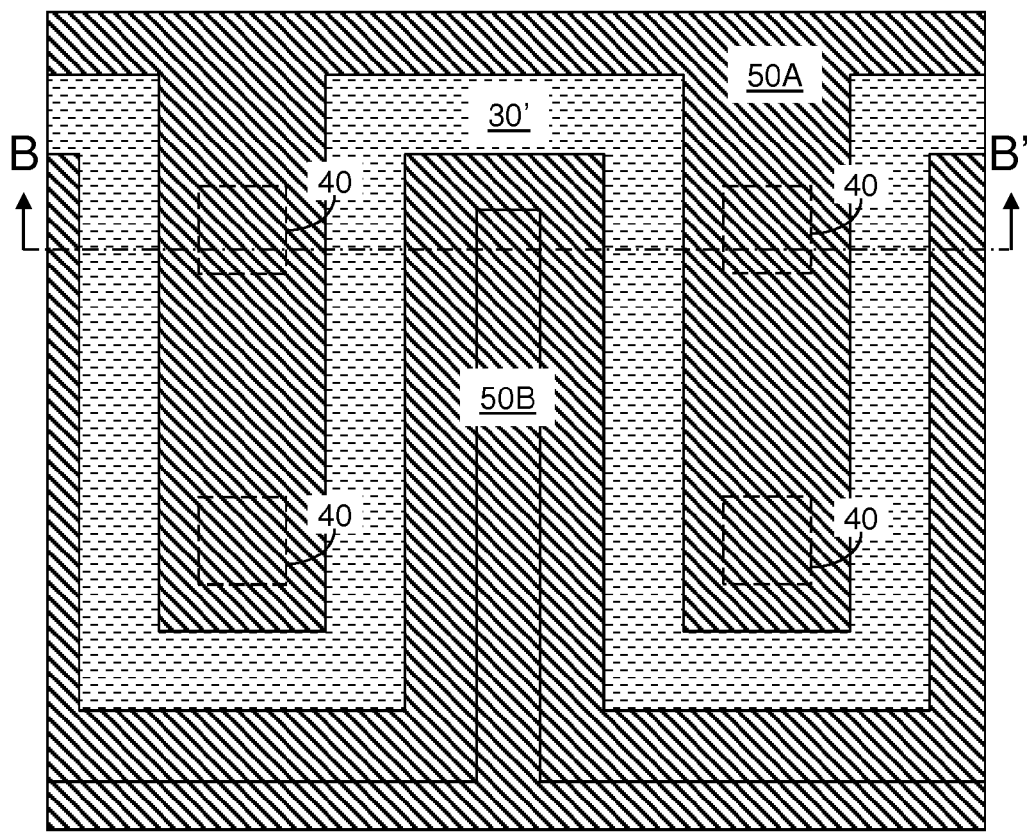
Figure 12B:
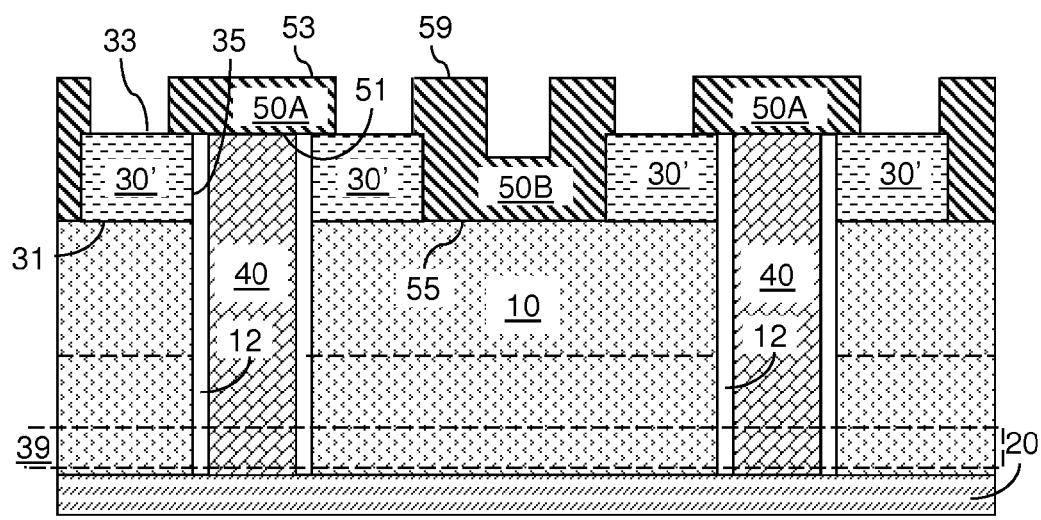

The processing steps of FIGS. 6A-9B are performed in the same manner as in the first embodiment to provide the second exemplary photovoltaic cell structure shown in FIGS. 12A and 12B. As in the first embodiment, the first contiguous metal wiring structure 50A functions as one node of the first exemplary photovoltaic cell, and the second contiguous metal wiring structure 50B functions as the other node of the first exemplary photovoltaic cell. The first contiguous metal wiring structure 50A makes an electrical contact with the surface region 39 through the at least one conductive through-substrate via 40 and the anti-reflective layer 20 that include a conductive material.

Figure 13A:
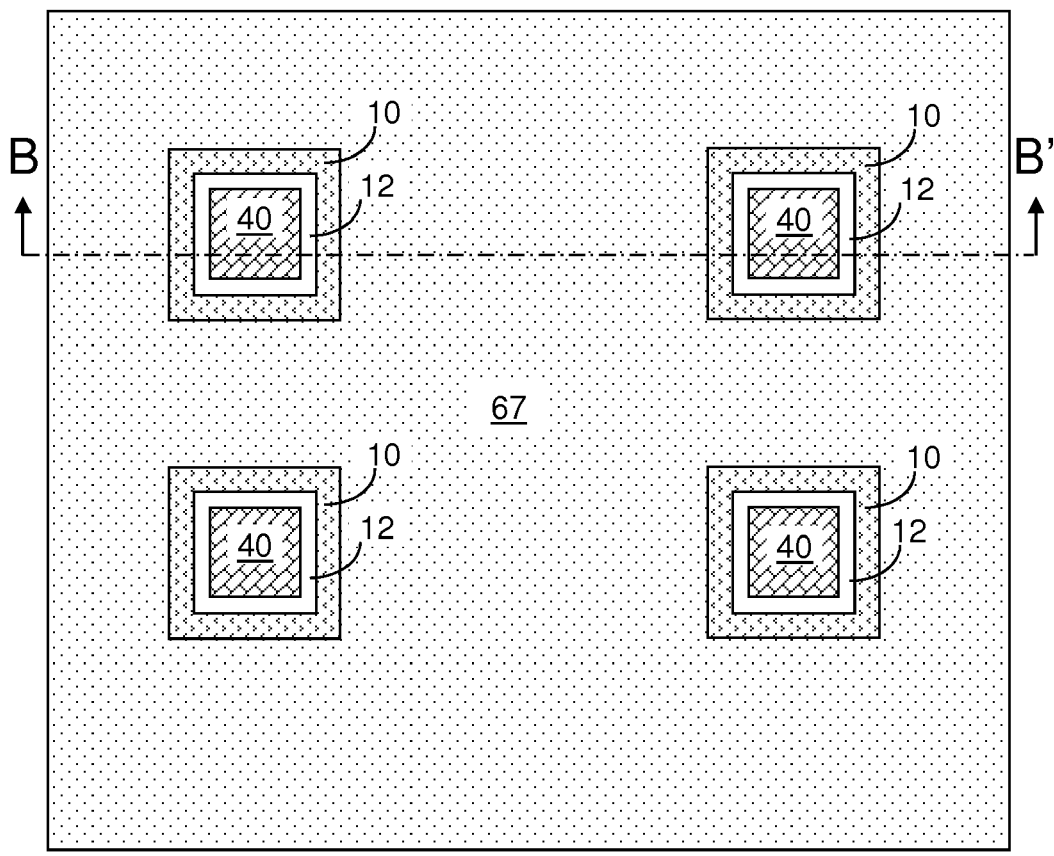
FIGS. 13A-14B are views of a third exemplary photovoltaic cell structure at various stages of a manufacturing process according to a third embodiment of the present invention.
Figure 13B:
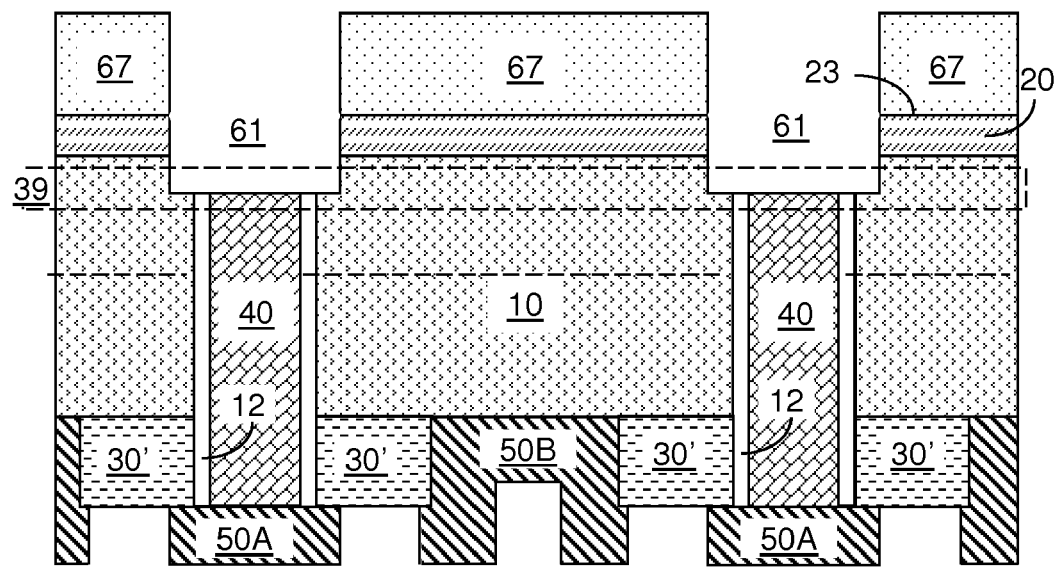

Referring to FIGS. 13A and 13B, a third exemplary photovoltaic cell structure according to a third embodiment of the present invention can be derived from the first exemplary photovoltaic cell structure of FIGS. 9A and 9B or from the second exemplary photovoltaic cell structure of FIGS. 12A and 12B by recessing at least one portion of the substrate 10 from the front side. Specifically, a fourth photoresist 67 can be applied on a distal surface 23 of the anti-reflective layer 20 and lithographically patterned to form at least one opening therein. Preferably, the at least one opening in the fourth photoresist 67 is aligned to the at least one conductive through-substrate via 40 located within the substrate 10. The pattern in the at least one opening in the fourth photoresist 67 is transferred through the anti-reflective layer 20 and into the surface region 39 of the substrate 10 by an etch. The etch may be an anisotropic etch that employs the fourth photoresist 67 as the etch mask.

The etch forms at least one recessed region 61 on the front side of the substrate 10, i.e., on the side of the substrate 10 that includes the surface region 39. The front side is located on the opposite side of the first and second contiguous metal wiring structures (50A, 50B). An end surface of the at least one conductive through-substrate via 40 is exposed in each of the at least one recessed region 61. Preferably, the depth of the at least one recessed region 61 is controlled so that the bottom surface of each recessed region 61 is located within the surface region 39 of the substrate 10. The fourth photoresist 67 is subsequently removed selective to the at least one conductive through-substrate via 40.

In the third embodiment, the anti-reflective layer 20 can be a dielectric material, a semiconducting material, or a conductive material. If the at least one conductive through-substrate via 40 is a one-dimensional array or a two-dimensional array of a plurality of conductive through-substrate vias 40, the at least one recessed region 61 can be a one-dimensional array or a two-dimensional array of a plurality of recessed regions 61.

As in the first embodiment, the front side of the first exemplary photovoltaic cell structure can have no conductive wiring structure because all conductive wiring structures (50A, 50B) are provided on the backside of the substrate 10. Thus, the second exemplary photovoltaic cell structure increases the efficiency and/or compactness over prior art structures.

Figure 14A:
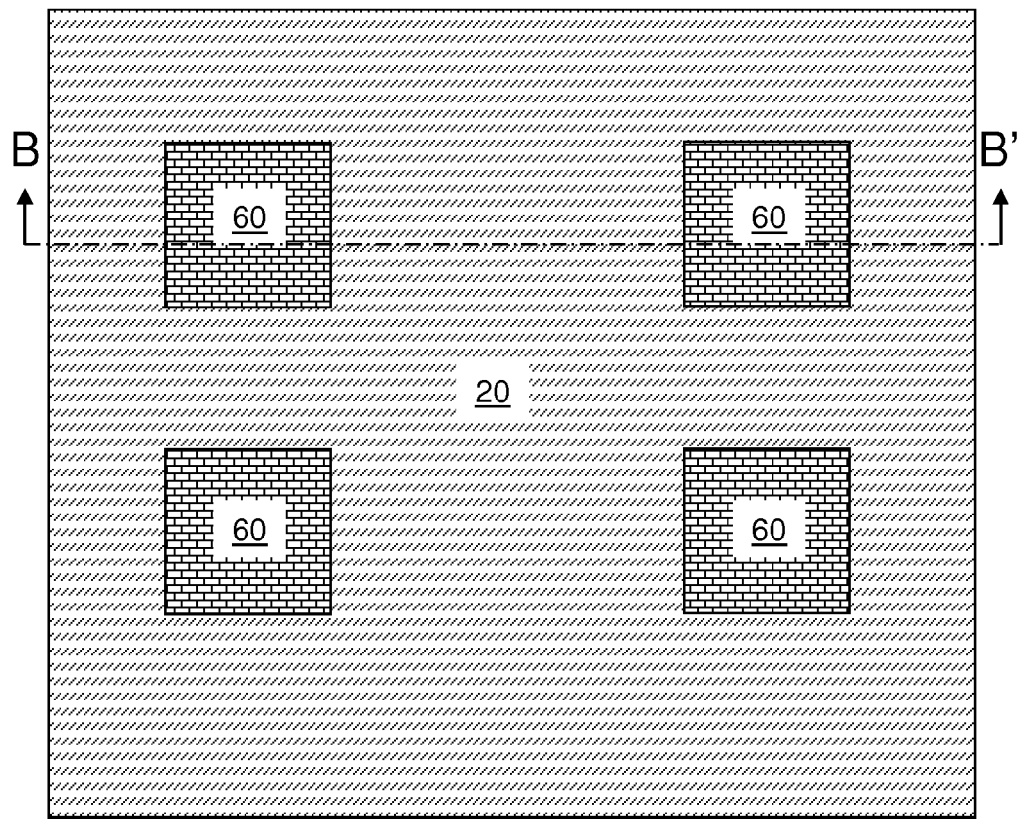
Figure 14B:
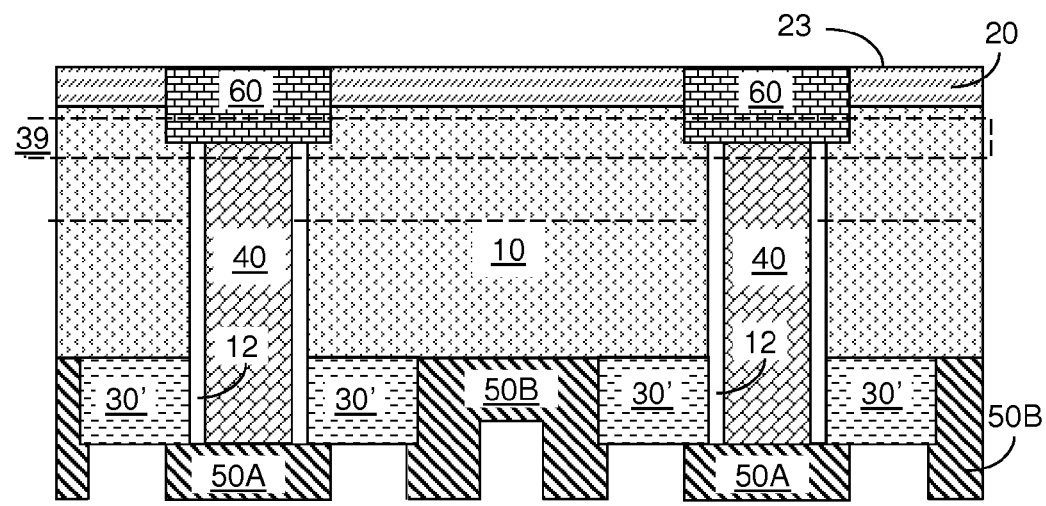

Referring to FIGS. 14A and 14B, at least one conductive plug 60 can be formed by depositing a conductive material in the at least one recessed region 61 and planarizing the conductive material. The planarization may be effected, for example, by chemical mechanical polishing, a recess etch, or a combination thereof. A top surface of the at least one conductive plug 60 can be coplanar with the distal surface 23 of the anti-reflective layer 20. The at least one conductive plug 60 contacts the at least one conductive through-substrate via 40 and the surface portion 10 of the substrate 10 that includes the photovoltaic material. The at least one conductive plug 60 laterally contacts sidewalls of the anti-reflective layer 20.

If the at least one conductive through-substrate via 40 is a one-dimensional array or a two-dimensional array of a plurality of conductive through-substrate vias 40, the at least one conductive plug 60 can be a one-dimensional array or a two-dimensional array of a plurality of conductive plugs 60. Each of the plurality of conductive plugs 60 does not contact any other of the plurality of conductive plugs 60.

The lateral dimensions of at least one conductive plug 60 can be greater, equal to, or lesser than the lateral dimensions of the at least one conductive through-substrate via 40. Thus, the area covered by the at least one conductive plug can be greater, equal to, or lesser than a horizontal cross-sectional area of the at least one conductive through-substrate via 40. The sidewalls of the at least one conductive plug 60 contacts sidewalls of the surface region 39 of the substrate 10. A bottom surface of the at least one conductive plug 60 contacts the end surface of an underlying conductive through-substrate via 40, and can contact a horizontal surface of the surface region 39 depending on the lateral extent of the at least one conductive plug 60.

The front side of the third exemplary photovoltaic structure is studded with the at least one conductive plug 60. Each of at least one conductive plug 16 is not connected to another of the least one conductive plug 60 on the front side. Thus, a conductive line is not present on the front side of the third exemplary photovoltaic structure. The area covered by the at least one conductive plug 60 can be minimized to a level lesser than prior art structures enable. For example, metal lines on the front surface of prior art photovoltaic cells cover over 10% of the area of a substrate. In contrast, the at least one conductive plug 60 in the third embodiment of the present invention can be employed to cover less than 2% of the area of the substrate 10 without degradation in performance because the at least one conductive plug 60 and the at least one conductive through-substrate via 40 provides an effective and short conductive path to the backside of the substrate 10, and the first contiguous metal wiring structures 50A can utilize a significant fraction, e.g., 40% or more, of the area of the substrate to form a conductive path.

Figure 15A:
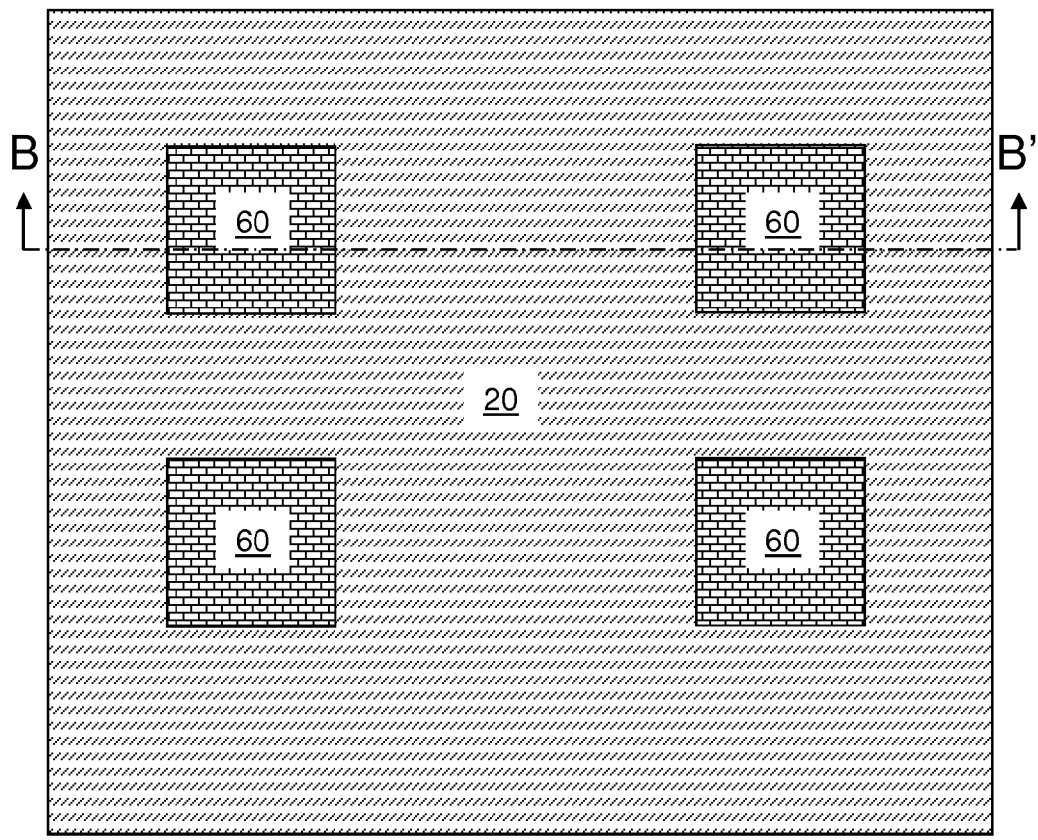
FIGS. 15A and 15B are views of a fourth exemplary photovoltaic cell structure according to a fourth embodiment of the present invention.
Figure 15B:
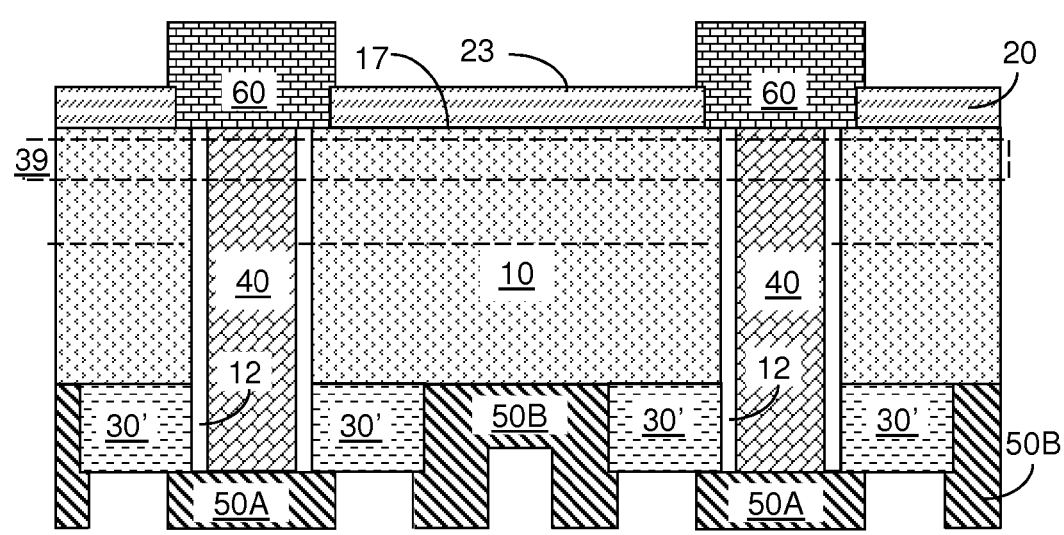

Referring to FIGS. 15A and 15B, a fourth exemplary photovoltaic cell structure according to a fourth embodiment of the present invention can be derived from the second exemplary photovoltaic cell structure of FIGS. 12A and 12B by recessing at least one portion of the anti-reflective layer 20. In the fourth embodiment, the anti-reflective layer 20 can be a dielectric material, a semiconducting material, or a conductive material.

For example, a fourth photoresist (not shown) can be applied on a distal surface 23 of the anti-reflective layer 20 and lithographically patterned to form at least one opening therein. Preferably, the at least one opening in the fourth photoresist is aligned to the at least one conductive through-substrate via 40 located within the substrate 10. The pattern in the at least one opening in the fourth photoresist is transferred through the anti-reflective layer 20. The pattern in the fourth photoresist is transferred is not transferred into the substrate 10.

A conductive material layer is deposited and lithographically patterned to form at least one conductive plug 60. The at least one conductive plug 60 contacts end surface(s) of the at least one conductive through-substrate via 40 and the front surface 17 of the substrate 10 that includes the photovoltaic material. The at least one conductive plug 60 laterally contacts sidewalls of the anti-reflective layer 20.

If the at least one conductive through-substrate via 40 is a one-dimensional array or a two-dimensional array of a plurality of conductive through-substrate vias 40, the at least one conductive plug 60 can be a one-dimensional array or a two-dimensional array of a plurality of conductive plugs 60. Each of the plurality of conductive plugs 60 does not contact any other of the plurality of conductive plugs 60.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A photovoltaic cell structure comprising:
a substrate including a photovoltaic material that generates a non-zero electric potential across a front surface and a back surface of said substrate upon irradiation by electromagnetic radiation, said substrate including a p-n junction between said front surface and said back surface and including a surface portion located between said front surface and said p-n junction;
at least one laterally-insulated through-substrate contact structure embedded in said substrate, wherein said at least one laterally-insulated through-substrate contact structure comprises a conductive through-substrate via contacting said surface portion and not conductively connected to any portion of said substrate between said p-n junction and said back surface;
a first contiguous metal wiring structure that is spaced from said back surface and is in contact with said at least one conductive through-substrate via;
a second contiguous metal wiring structure in contact with said back surface of said substrate, wherein said non-zero electric potential is provided across said first and second contiguous metal wiring structures; and
an anti-reflective layer located directly on said front surface, wherein said anti-reflective layer is a conductive material, and said at least one conductive through-substrate via is not in contact with said anti-reflective layer, wherein a horizontal surface of said at least one conductive through-substrate via is vertically spaced from said anti-reflective layer by said surface portion of said photovoltaic material, and said surface portion vertically contacts said at least one conductive through-substrate via and said anti-reflective layer.

2. The photovoltaic cell structure of claim 1, wherein said at least one laterally-insulated through-substrate contact structure further comprises a dielectric liner.

3. The photovoltaic cell structure of claim 2, wherein at least one dielectric liner and at least one conductive through-substrate via that are within said at least one laterally-insulated through-substrate contact structure protrude out of said back surface of said substrate, wherein said photovoltaic cell further comprises a patterned dielectric layer having a proximal surface that contacts a portion of said back surface and a vertical surface that contacts outer sidewalls of said at least one dielectric liner.

4. The photovoltaic cell structure of claim 3, wherein said patterned dielectric layer has a distal surface that is substantially coplanar with a surface of said at least one conductive through-substrate via.

5. The photovoltaic cell structure of claim 3, wherein a proximal surface of said first contiguous metal wiring structure is in contact with said distal surface of said patterned dielectric layer, and vertical sidewalls of said first and second contiguous metal wiring structures are directly adjoined to a distal surface of said patterned dielectric layer.

6. The photovoltaic cell structure of claim 3, wherein an entirety of a proximal surface of said first contiguous metal wiring structure is coplanar with a distal surface of said patterned dielectric layer, and a distal surface of said second contiguous metal wiring structure is coplanar with a distal surface of said first contiguous metal wiring structure.

7. The photovoltaic cell structure of claim 2, wherein an end surface of said conductive through-substrate via is located within said substrate and is spaced from said front surface.

8. The photovoltaic cell structure of claim 2, wherein said at least one laterally-insulated through-substrate contact structure is a plurality of laterally-insulated through-substrate contact structures.

9. The photovoltaic cell structure of claim 8, wherein said plurality of laterally-insulated through-substrate contact structure is a one-dimensional array of laterally-insulated through-substrate contact structures or a two-dimensional array of laterally-insulated through-substrate contact structures.

10. The photovoltaic cell structure of claim 1, wherein said substrate includes a p-doped semiconductor material and an n-doped semiconductor material that form said p-n junction at a surface between said front surface and said back surface.

* * * * *